United States Patent
Ko et al.

(10) Patent No.: US 8,993,993 B2
(45) Date of Patent: Mar. 31, 2015

(54) SEMICONDUCTOR LIGHT EMITTING DEVICE AND METHOD FOR FABRICATING THE SAME

(75) Inventors: Hyung Duk Ko, Seoul (KR); Jung Ja Yang, Gyunggi-do (KR); Yu Seung Kim, Seoul (KR); Youn Joon Sung, Gyunggi-do (KR); Soo Jin Jung, Gyunggi-do (KR); Dae Cheon Kim, Gyunggi-do (KR); Byung Kwun Lee, Gyunggi-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 172 days.

(21) Appl. No.: 13/104,487

(22) Filed: May 10, 2011

(65) Prior Publication Data
US 2011/0278538 A1 Nov. 17, 2011

(30) Foreign Application Priority Data

May 11, 2010 (KR) .................. 10-2010-0044171
Oct. 21, 2010 (KR) .................. 10-2010-0102832

(51) Int. Cl.
*H01L 31/00* (2006.01)
*H01L 33/20* (2010.01)
(Continued)

(52) U.S. Cl.
CPC .............. *H01L 33/20* (2013.01); *H01L 33/38* (2013.01); *H01L 33/42* (2013.01); *H01L 2933/0091* (2013.01)
USPC 257/13; 257/103; 257/E33.008; 257/E33.023; 257/E33.068; 438/29

(58) Field of Classification Search
USPC ............... 257/13, 103, E33.008, E33.023, 257/E33.068; 438/29
See application file for complete search history.

(56) References Cited

U.S. PATENT DOCUMENTS 4,122,486 A * 10/1978 Ono et al. ................. 257/95
4,673,254 A * 6/1987 Kato et al. ................. 359/599
(Continued)

FOREIGN PATENT DOCUMENTS

KR 10-0640497 B1 10/2006

OTHER PUBLICATIONS

Office Action from the State Intellectual Property Office of P.R. China with English Translation issued in Chinese Application No. 201110124931.9 dated Jun. 26, 2013.
(Continued)

*Primary Examiner* — Mohammad Islam
*Assistant Examiner* — Ankush Singal
(74) *Attorney, Agent, or Firm* — McDermott Will & Emery LLP (57) ABSTRACT

Provided are a semiconductor light emitting device and a method for fabricating the same. The semiconductor light emitting device includes a light emitting structure and a pattern. The light emitting structure includes a first-conductivity-type semiconductor layer, an active layer, and a second-conductivity-type semiconductor layer. The pattern is formed on at least one light emitting surface among the surfaces of the light emitting structure. The pattern has a plurality of convex or concave parts that are similar in shape. The light emitting surface with the pattern formed thereon has a plurality of virtual reference regions that are equal in size and are arranged in a regular manner. The convex or concave part is disposed in the reference regions such that a part of the edge thereof is in contact with the outline of one of the plurality of virtual reference regions.

19 Claims, 10 Drawing Sheets

(51) Int. Cl.
*H01L 33/38* (2010.01)
*H01L 33/42* (2010.01)

(56) References Cited

U.S. PATENT DOCUMENTS

| | | | | |
|---|---|---|---|---|
| 4,819,245 | A * | 4/1989 | Morimoto et al. | 372/46.012 |
| 4,982,214 | A * | 1/1991 | Matsui | 396/150 |
| 5,814,839 | A * | 9/1998 | Hosoba | 257/96 |
| 6,630,684 | B2 * | 10/2003 | Lee et al. | 257/40 |
| 6,754,012 | B2 * | 6/2004 | Terauchi et al. | 359/726 |
| 6,984,841 | B2 * | 1/2006 | Tsuda et al. | 257/12 |
| 7,173,289 | B1 | 2/2007 | Wu et al. | |
| 7,244,957 | B2 * | 7/2007 | Nakajo et al. | 257/13 |
| 7,348,600 | B2 * | 3/2008 | Narukawa et al. | 257/79 |
| 7,376,169 | B2 * | 5/2008 | Henrichs | 372/99 |
| 7,438,974 | B2 * | 10/2008 | Obuhowich | 428/346 |
| 7,473,498 | B2 * | 1/2009 | Sun | 430/5 |
| 7,521,727 | B2 | 4/2009 | Khanarian et al. | |
| 7,615,472 | B2 * | 11/2009 | Takasone | 438/479 |
| 7,858,438 | B2 * | 12/2010 | Chen et al. | 438/108 |
| 7,859,026 | B2 * | 12/2010 | Ligon | 257/213 |
| 7,871,907 | B2 * | 1/2011 | Sun | 438/478 |
| 7,986,085 | B2 * | 7/2011 | Shinohara et al. | 313/498 |
| 8,089,081 | B2 * | 1/2012 | Kitagawa et al. | 257/95 |
| 8,158,994 | B2 * | 4/2012 | Hiraoka et al. | 257/96 |
| 8,179,941 | B2 * | 5/2012 | Hirata et al. | 372/44.01 |
| 2002/0163726 | A1 * | 11/2002 | Masaki et al. | 359/581 |
| 2004/0135155 | A1 * | 7/2004 | Otsuka et al. | 257/79 |
| 2004/0136078 | A1 * | 7/2004 | Shueh et al. | 359/619 |
| 2004/0206969 | A1 | 10/2004 | Orita | |
| 2004/0259296 | A1 * | 12/2004 | Voutsas et al. | 438/166 |
| 2005/0064675 | A1 * | 3/2005 | Kim | 438/401 |
| 2005/0079693 | A1 * | 4/2005 | Kang et al. | 438/487 |
| 2005/0082544 | A1 * | 4/2005 | Narukawa et al. | 257/79 |
| 2005/0174511 | A1 * | 8/2005 | Sugawara et al. | 349/106 |
| 2005/0189558 | A1 * | 9/2005 | Liu | 257/100 |
| 2006/0033113 | A1 * | 2/2006 | Lee et al. | 257/80 |
| 2006/0051042 | A1 * | 3/2006 | Noda et al. | 385/129 |
| 2006/0125120 | A1 * | 6/2006 | Kim | 257/797 |
| 2006/0146562 | A1 * | 7/2006 | Ko et al. | 362/561 |
| 2006/0175962 | A1 * | 8/2006 | Fujimoto et al. | 313/506 |
| 2006/0278888 | A1 | 12/2006 | Kim et al. | |
| 2007/0096123 | A1 * | 5/2007 | Utsumi et al. | 257/86 |
| 2007/0184638 | A1 * | 8/2007 | Kang et al. | 438/487 |
| 2007/0267640 | A1 * | 11/2007 | Lee et al. | 257/94 |
| 2008/0030975 | A1 * | 2/2008 | Miyashita et al. | 362/26 |
| 2008/0035953 | A1 * | 2/2008 | Beom et al. | 257/103 |
| 2008/0043795 | A1 | 2/2008 | Hsueh et al. | |
| 2008/0106192 | A1 * | 5/2008 | Koo et al. | 313/504 |
| 2008/0149952 | A1 * | 6/2008 | Kasahara et al. | 257/91 |
| 2008/0151153 | A1 * | 6/2008 | Sugawara et al. | 349/106 |
| 2008/0232135 | A1 * | 9/2008 | Kinder et al. | 362/615 |
| 2009/0014734 | A1 * | 1/2009 | Nishikawa et al. | 257/95 |
| 2009/0026475 | A1 * | 1/2009 | Yamaguchi et al. | 257/98 |
| 2009/0028563 | A1 * | 1/2009 | Tanigawa et al. | 398/65 |
| 2009/0127539 | A1 * | 5/2009 | Shakuda | 257/13 |
| 2009/0261318 | A1 * | 10/2009 | Cheong | 257/13 |
| 2009/0267098 | A1 * | 10/2009 | Choi | 257/98 |
| 2010/0032701 | A1 * | 2/2010 | Fudeta | 257/98 |
| 2010/0072501 | A1 * | 3/2010 | Wakai et al. | 257/98 |
| 2010/0178756 | A1 * | 7/2010 | Takizawa et al. | 438/493 |
| 2010/0253889 | A1 * | 10/2010 | Sugawara et al. | 349/106 |
| 2010/0314643 | A1 * | 12/2010 | Lin | 257/98 |
| 2010/0314651 | A1 * | 12/2010 | Lin | 257/98 |
| 2010/0327298 | A1 * | 12/2010 | Konno et al. | 257/94 |
| 2011/0061717 | A1 * | 3/2011 | Kwon et al. | 136/246 |
| 2011/0079800 | A1 * | 4/2011 | Konno | 257/95 |

OTHER PUBLICATIONS

Extended European Search Report issued in European Patent Application No. EP 11165384.6 dated Dec. 11, 2013.

* cited by examiner

SEMICONDUCTOR LIGHT EMITTING DEVICE AND METHOD FOR FABRICATING THE SAME

CROSS-REFERENCE TO RELATED APPLICATIONS

This application claims the priority of Korean Patent Application Nos. 10-2010-0044171 filed on May 11, 2010 and 10-2010-0102832 filed on Oct. 21, 2010, in the Korean Intellectual Property Office, the disclosures of which are incorporated herein by reference.

BACKGROUND OF THE INVENTION

1. Field of the Invention

The present invention relates to semiconductor light emitting devices, and more particularly, to a semiconductor light emitting device and a method for fabricating the same.

2. Description of the Related Art

In general, a light emitting diode (LED) uses the characteristics of a compound semiconductor to convert electrical energy into infrared ray signals, visible ray signals, or light signals. A light emitting diode is a kind of electroluminescence (EL) device, and a light emitting diode based on a Group III-V compound semiconductor is being practically used. A Group III nitride-based compound semiconductor is a direct-transition semiconductor. Because Group III nitride-based compound semiconductors can operate in a stable manner, Group III nitride-based compound semiconductors are widely used in light emitting devices such as light emitting diodes (LEDs) and laser diodes (LDs).

Research is being conducted into improving the light emission efficiency (i.e., the light extraction efficiency) of a semiconductor light emitting device by forming a concavo-convex structure in a light extracting region of a light emitting device. The propagation of light is restricted at the interface between material layers having different refractivity. When light propagates from a semiconductor layer with high refractivity (n>1) to an air layer with low refractivity (n=1), the light must be incident on the flat interface at less than a predetermined angle (critical angle) to the vertical direction of the interface. If light is incident on the interface at more than a predetermined angle to the vertical direction of the interface, total reflection occurs in the flat interface, thus significantly reducing light extraction efficiency. In order to prevent this, attempts have been made to introduce a concavo-convex structure in the interface.

SUMMARY OF THE INVENTION

An aspect of the present invention provides a semiconductor light emitting device with improved external light extraction efficiency.

According to an aspect of the present invention, there is provided a semiconductor light emitting device including: a light emitting structure including a first-conductivity-type semiconductor layer, an active layer, and a second-conductivity-type semiconductor layer; and a pattern formed on at least one light emitting surface among the surfaces of the light emitting structure, the pattern having a plurality of convex or concave parts that are similar in shape, wherein the light emitting surface with the pattern formed thereon has a plurality of virtual reference regions that are equal in size and are arranged in a regular manner, and the convex or concave part is disposed in the reference region while contacting the outline of the reference region.

The convex or concave parts arranged in one direction, among the plurality of convex or concave parts, may be sequentially disposed in the reference regions in such a manner as to rotate around the centers of the reference regions in a clockwise or counterclockwise direction.

The light emitting structure may be formed on a substrate, and the pattern may be formed on the substrate.

The pattern may be formed on the second-conductivity-type semiconductor layer.

The pattern maybe formed by etching a portion of the second-conductivity-type semiconductor layer.

The second-conductivity-type semiconductor layer may be doped with n-type or p-type impurities.

The size of the reference region may be equal to or greater than the size of the contact surface between the reference region and the convex or concave part.

The contact surfaces between the reference regions and the convex or concave parts may have different sizes.

The convex or concave parts may be arranged in ascending order of the size of the contact surface with the reference region to constitute a group, and the group may be disposed in a repeated manner.

The reference region may have a circular shape.

The reference region may have a diameter of 0.1 μm to 5 μm.

The interval between the reference regions may be equal to or smaller than 0.5 μm.

The contact surfaces between the reference regions and the convex or concave parts may have a circular shape.

The contact surfaces between the reference regions and the convex or concave parts may have a diameter of 0.1 μm to 5 μm.

The convex or concave parts may have a shape similar to one of a hemispherical shape and a conical shape.

The contact surfaces between the reference regions and the convex or concave parts may have the same shape.

According to another aspect of the present invention, there is provided a method for fabricating a semiconductor light emitting device, including: forming a light emitting structure including a first-conductivity-type semiconductor layer, an active layer, and a second-conductivity-type semiconductor layer on a growth substrate; forming a conductive substrate on the light emitting structure; removing the growth substrate; and forming a pattern on at least one light emitting surface among the surfaces of the light emitting structure exposed by removing the growth substrate, wherein the light emitting surface with the pattern formed thereon has a plurality of virtual reference regions that are equal in size and are arranged in a regular manner, the convex or concave part is disposed in the reference region while contacting the outline of the reference region, and the forming of the pattern is performed through a dry etching process.

According to another aspect of the present invention, there is provided a method for fabricating a semiconductor light emitting device, including: forming a light emitting structure including a first-conductivity-type semiconductor layer, an active layer, and a second-conductivity-type semiconductor layer on a growth substrate; and forming a pattern on at least one light emitting surface among the surfaces of the light emitting structure, wherein the light emitting surface with the pattern formed thereon has a plurality of virtual reference regions that are equal in size and are arranged in a regular manner, the convex or concave part is disposed in the reference region while contacting the outline of the reference region, and the forming of the pattern is performed through a dry etching process.

The convex or concave parts arranged in one direction, among the plurality of convex or concave parts, may be sequentially disposed in the reference regions in such a manner as to rotate around the centers of the reference regions in a clockwise or counterclockwise direction.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like reference numerals in the drawings denote like elements, and thus their description will be omitted.

Figure 1:
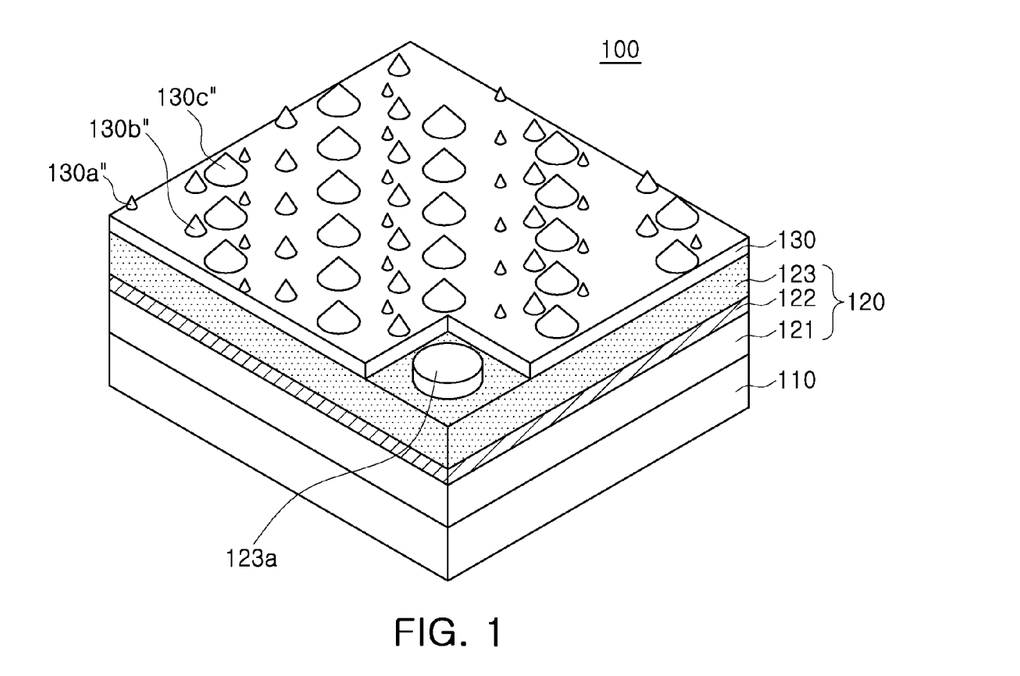
FIG. 1 is a perspective view of a semiconductor light emitting device according to a first exemplary embodiment of the present invention.

FIG. 1 is a perspective view of a semiconductor light emitting device according to a first exemplary embodiment of the present invention.

Referring to FIG. 1, in a semiconductor light emitting device 100 according to a first exemplary embodiment of the present invention, a light emitting structure 120 including an active region 122 is formed on a substrate 110, and a pattern 130 having a plurality of convex parts 130a, 130b and 130c are formed on the light emitting structure 120. The light emitting structure 120 includes a first-conductivity-type semiconductor layer 121, an active layer 122, and a second-conductivity-type semiconductor layer 123 that are sequentially stacked.

In this embodiment, the first-conductivity-type semiconductor layer 121 and the second-conductivity-type semiconductor layer 123 of the light emitting structure 120 may be respectively a p-type semiconductor layer and an n-type semiconductor layer, and may be formed of a nitride semiconductor; however, the present invention is not limited thereto. In this embodiment, it may be understood that the first conductivity type and the second conductivity type are respectively a p type and an n type. The first-conductivity-type semiconductor layer 121 and the second-conductivity-type semiconductor layer 123 has a composition formula of $Al_xIn_yGa_{(1-x-y)}N$ ($0 \leq x \leq 1$, $0 \leq y \leq 1$, and $0 \leq x+y \leq 1$), and materials such as GaN, AlGaN, and InGaN may correspond thereto. The active layer 122 formed between the first-conductivity-type semiconductor layer 121 and the second-conductivity-type semiconductor layer 123 emits a given energy of light by electron-hole recombination. The active layer 122 may have a multiple quantum well (MQW) structure (e.g., an InGaN/GaN structure) with an alternate stack of quantum well layers and quantum barrier layers. The first-conductivity-type semiconductor layer 121 and the second-conductivity-type semiconductor layer 123 may be formed through semiconductor growth processes such as MOCVD (Metal Organic Chemical Vapor Deposition), MBE (Molecular Beam Epitaxy), and HVPE (Hydride Vapor Phase Epitaxy).

The substrate 110 may include a conductive substrate. If the substrate 110 is a conductive substrate, it may serve as a support member supporting the light emitting structure 120 in a laser lift-off process for removing a semiconductor growth substrate (not illustrated) from the light emitting structure 120 with a sequential stack of the first-conductivity-type semiconductor layer 121, the active layer 122 and the second-conductivity-type semiconductor layer 123, and may include a material including any one of Au, Ni, Al, Cu, W, Si, Se and GaAs, for example, a Si substrate doped with Al. In this embodiment, the conductive substrate 110 may be joined to the light emitting structure 120 through the medium of a conductive adhesive layer (not illustrated). For example, the conductive adhesive layer may include a eutectic metal such as AuSn.

The substrate 110 is not limited to a conductive substrate. The substrate 110 may include a growth substrate on which the first-conductivity-type semiconductor layer 121, the active layer 122 and the second-conductivity-type semiconductor layer 123 are sequentially stacked, for example, a substrate formed of sapphire, SiC, $MgAl_2O_4$, MgO, $LiAlO_2$, $LiGaO_2$, or GaN.

The pattern 130 having the convex parts 130a, 130b and 130c may include a transparent conductor or a transparent insulator. The transparent insulator may include a material such as $SiO_2$, $SiN_x$, $Al_2O_3$, HfO, $TiO_2$, or ZrO. The transparent conductor may include a transparent conductive oxide ($TCO_s$) such as an indium (In) oxide containing ZnO or additives (e.g., Mg, Ag, Zn, Sc, Hf, Zr, Te, Se, Ta, W, Nb, Cu, Si, Ni, Co, Mo, and Cr).

A second-conductivity-type electrode 123a connected electrically to the second-conductivity-type semiconductor layer 123 may be formed on the top surface of the pattern 130. The second-conductivity-type electrode 123a may be formed on any region of the top surface of the concavo-convex part 130. The second-conductivity-type electrode 123a may be formed on the center of the pattern 130 in order to uniformalize the distribution of a current transmitted to the second-conductivity-type semiconductor layer 123. Also, if the second-conductivity-type electrode 123a is formed on a region overlapping with the surficial concavo-convex parts 130a, 130b and 130c of the pattern 130, because the contact surface of the second-conductivity-type electrode 123a has a surface roughness due to the surficial concavo-convex parts, the electrical characteristics may degrade, that is, the resistance of a current flowing through the second-conductivity-type electrode 123a into the second-conductivity-type semiconductor layer 123 may increase. Therefore, the second-conductivity-type electrode 123a maybe formed on a region not overlapping with the concavo-convex pattern. Thus, as illustrated in FIG. 1, the second-conductivity-type electrode 123a maybe formed on the second-conductivity-type semiconductor layer 123 exposed by etching a portion of the pattern 130; however, the present invention is not limited thereto. If the pattern 130 includes a transparent conductive oxide, the second-conductivity-type electrode 123a may be formed on the pattern 130.

Figure 2:
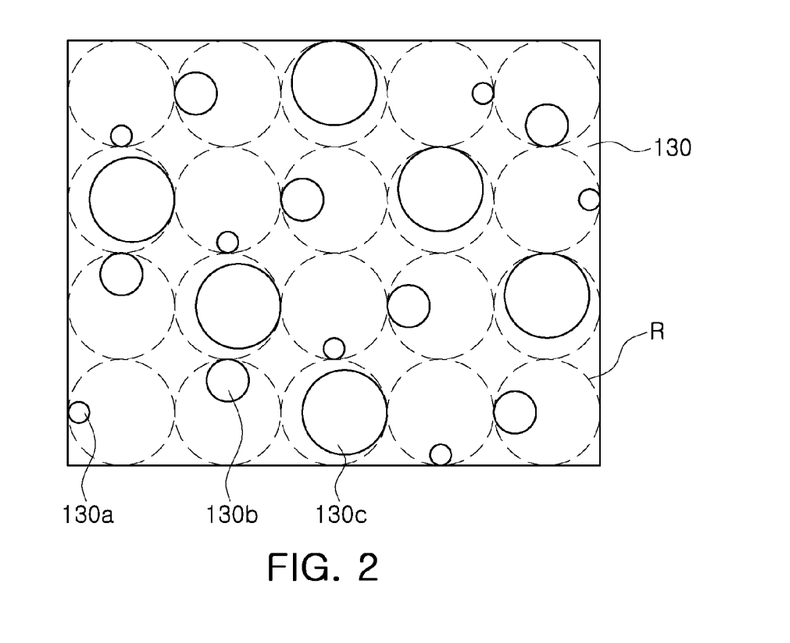
FIG. 2 is a top plan view illustrating a pattern formed on a light emitting structure of the semiconductor light emitting device of FIG. 1 according to an exemplary embodiment of the present invention.

FIG. 2 is a top plan view illustrating the pattern 130 formed on the light emitting structure 120 of the semiconductor light emitting device of FIG. 1 according to an exemplary embodiment of the present invention.

The illustration of the shape of the electrode 123a formed on the top surface of the light emitting structure 120 is omitted for clearer illustration of the pattern 130. The pattern 130 is to increase the efficiency of the emission of light, which is generated in the active layer 122 of the light emitting structure 120, to the outside through the second-conductivity-type semiconductor layer 123 that has a higher level of refractivity than air. The pattern 130 includes a plurality of convex parts 130a, 130b and 130c that are disposed in a regular manner.

Specifically, a light emitting surface with the pattern 130 formed thereon has a plurality of virtual reference regions R that are equal in size and are arranged in a regular manner, the convex part (130a, 130b, 130c) is disposed in the reference region R while contacting the outline of the reference region R. The outline of the reference region R means a boundary line between the inside and the outside of a closed curve of the reference region R. As illustrated in FIG. 2, if the reference region R has a circular shape, the outline of the reference region R becomes a circumference. Among the plurality of convex parts 130a, 130b and 130c, the convex parts arranged in one direction are sequentially disposed in the reference regions R in such a manner as to rotate around the centers of the reference regions R in a clockwise or counterclockwise direction; however, the present invention is not limited thereto. The convex parts are not limited to being arranged in one direction, if the convex parts are only disposed in the reference regions R while contacting the outlines of the reference regions R. Also, as illustrated in FIG. 2, the convex parts 130a, 130b and 130c may be formed such that the bottom boundaries of the convex parts contact the outline of the reference region R.

Referring to FIG. 2, the pattern 130 includes three circular convex parts 130a, 130b and 130c with different sizes, and one pattern may be disposed in one reference region R. Thus, in this embodiment, the size of the reference region R may be equal to or larger than the size of each pattern 130a/130b/130c. Specifically, the reference region may be formed to have a diameter of 1 μm to 3 μm, and the pattern may be formed to have a diameter of 0.5 μm to 2 μm. Also, in this embodiment, it is illustrated that the convex parts 130a, 130b and 130c have different sizes. However, the pattern 130 may be formed to have one convex part having the same size.

In this embodiment, it is illustrated that the reference regions R contact each other. However, the reference regions R may be disposed at regular intervals. For example, the interval between the reference regions R may be equal to or smaller than 0.5 μm. The filling rate of the pattern 130 increases as the interval between the reference regions R decreases. Therefore, the light extraction efficiency may increase as the interval between the reference regions R decreases. The convex parts 130a, 130b and 130c may be disposed to contact the outlines of the reference regions R. Also, the convex parts 130a, 130b and 130c may be disposed in such a manner as to rotate around the centers of the reference regions R by 90° in a clockwise direction. In this embodiment, the convex parts 130a, 130b and 130c may be arranged in ascending order of their sizes to constitute a group, and the group may be disposed in a repeated manner. However, the present invention is not limited to such an arrangement order. Patterns having different sizes may be arranged to constitute a group, and the group may be disposed in a repeated manner. The arrangement order of the convex parts 130a, 130b and 130c in the group is not limited to a specific order.

Unlike this embodiment, the convex parts 130a, 130b and 130c may be disposed in such a manner as to rotate around the centers of the reference regions R in a counterclockwise direction, and may include three or more convex parts of different sizes. Also, the rotation angle of each pattern is not limited to 90°. That is, any angle is possible if only it maintains a constant angle. When compared to the case in which the patterns having the same size and shape are formed at regular intervals in a regular manner, the semiconductor light emitting device according to this embodiment can increase the light extraction efficiency thereof. Also, it can increase the light extraction efficiency due to the irregularity of the patterns and can improve the light distribution effect due to the regular arrangement of the patterns. That is, if the patterns are formed in a completely irregular manner, the light extraction efficiency can be increased due to the irregularity of the patterns. However, the light distribution may increase due to the difference in the partial etching degree on the light emitting surface, thus causing a problem in light uniformity. According to an exemplary embodiment of the present invention, the light extraction efficiency can be increased by the randomness of the patterns, and the light uniformity can be increased by the improved light distribution.

Figure 3:
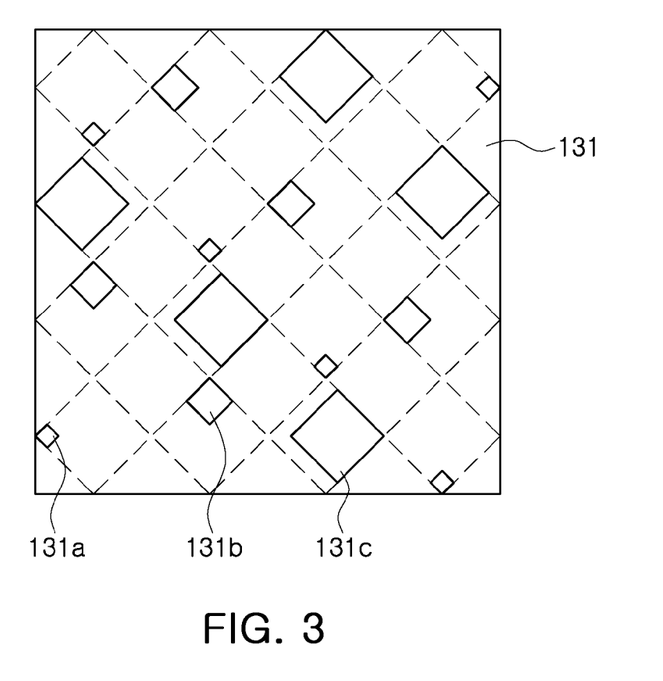
FIG. 3 is a top plan view illustrating a pattern formed on a light emitting structure of a semiconductor light emitting device according to another exemplary embodiment of the present invention.

FIG. 3 is a top plan view illustrating a pattern 131 formed on a light emitting structure of a semiconductor light emitting device according to another exemplary embodiment of the present invention.

According to this embodiment, the pattern 131 has a plurality of convex parts 131a, 131b and 131c that have the same shape but different sizes. The convex parts 131a, 131b and 131c contact the boundaries of virtual reference regions R that are equal in size and are arranged in a regular manner. Also, the convex parts 131a, 131b and 131c are disposed in the reference regions R in such a manner as to rotate around the centers of the reference regions R in a predetermined direction. Unlike the embodiment illustrated in FIG. 2, the bottom surface of each convex part has a diamond shape, and the reference region R also has a diamond shape. According to this embodiment, the convex parts 131a, 131b and 131c and the reference regions R have the same shape but have different sizes. However, the patterns 131a, 131b and 131c and the reference regions R may have different shapes. Although not illustrated, the pattern and the reference region may have various shapes such as a circle, an ellipse, a diamond, and a square.

Figure 4:
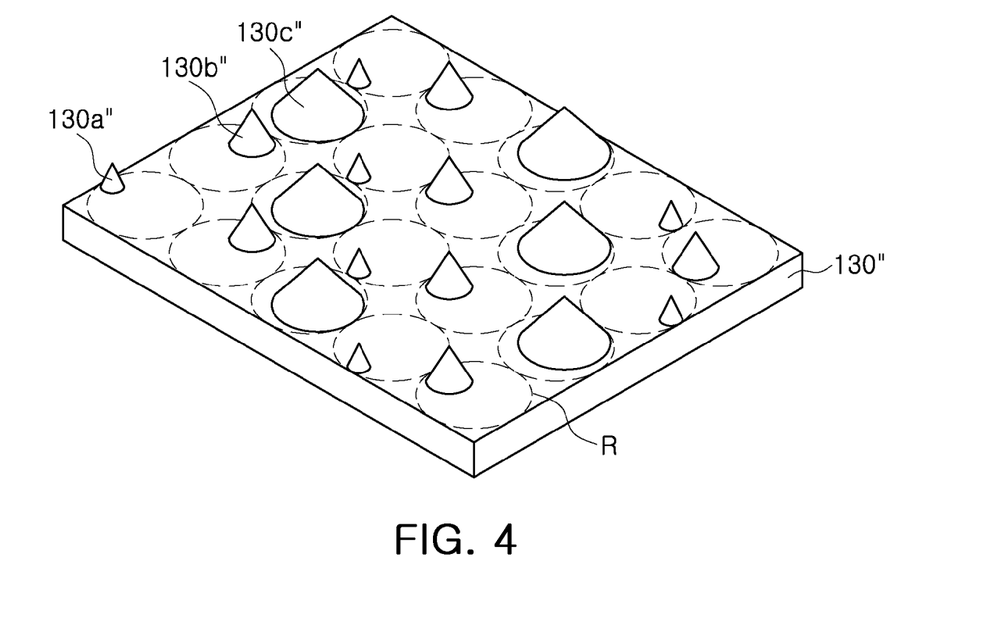
FIG. 4 is a perspective view illustrating a pattern of the semiconductor light emitting device of FIG. 1 according to an exemplary embodiment of the present invention.
Figure 5:
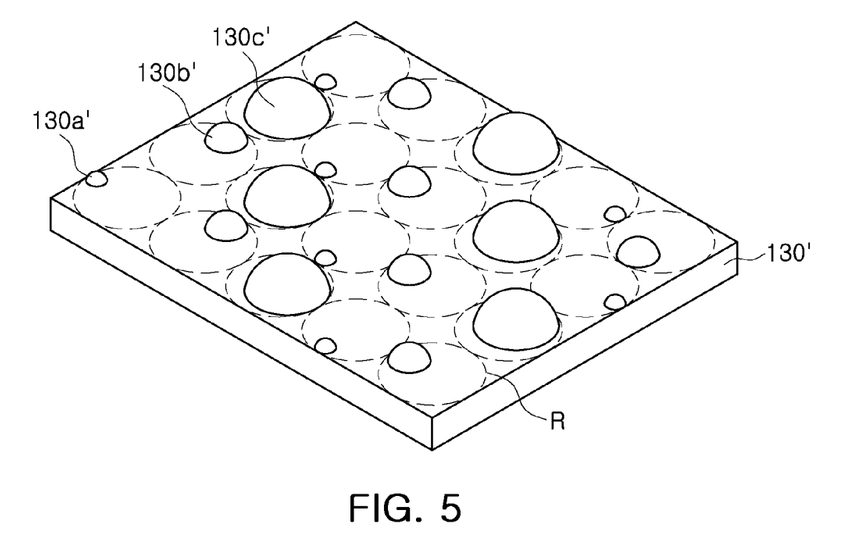
FIG. 5 is a perspective view illustrating a pattern of a semiconductor light emitting device according to another exemplary embodiment of the present invention.

FIG. 4 is a perspective view illustrating the pattern 130 of the semiconductor light emitting device 100 of FIG. 1 according to an exemplary embodiment of the present invention. FIG. 5 is a perspective view illustrating a pattern of the semiconductor light emitting device according to another exemplary embodiment of the present invention.

Figure 7:
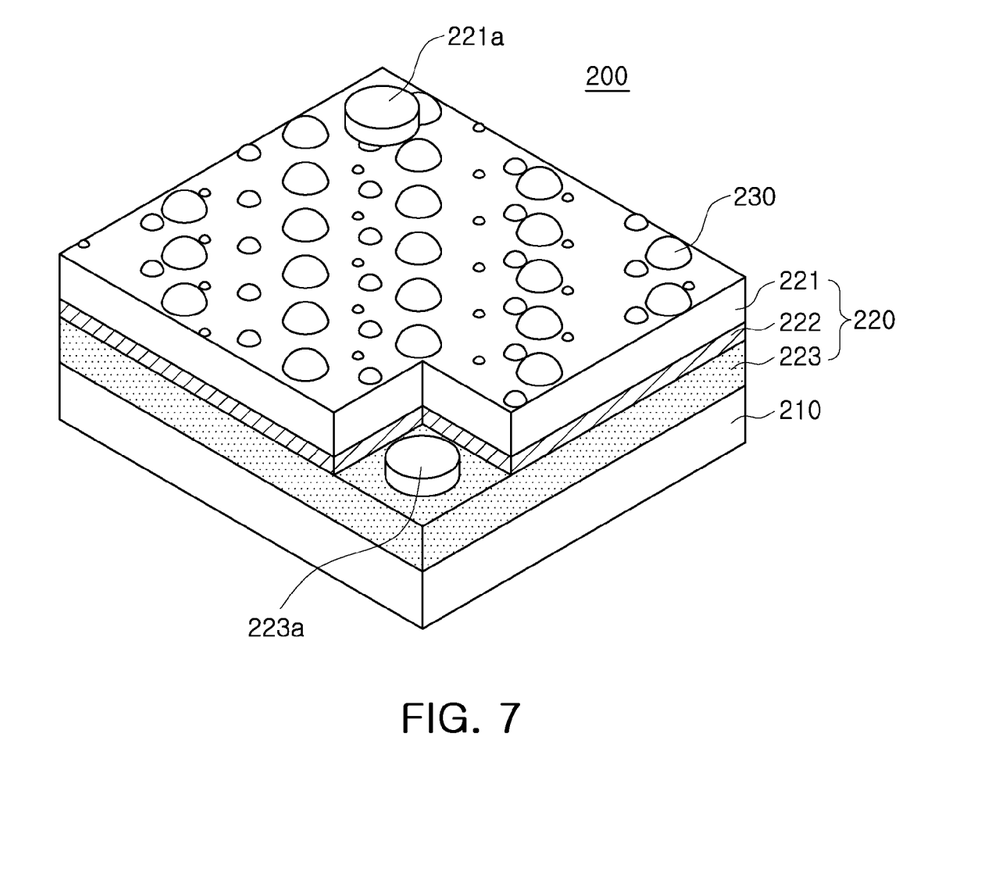
FIG. 7 is a perspective view of a semiconductor light emitting device according to a second exemplary embodiment of the present invention.
Figure 8:
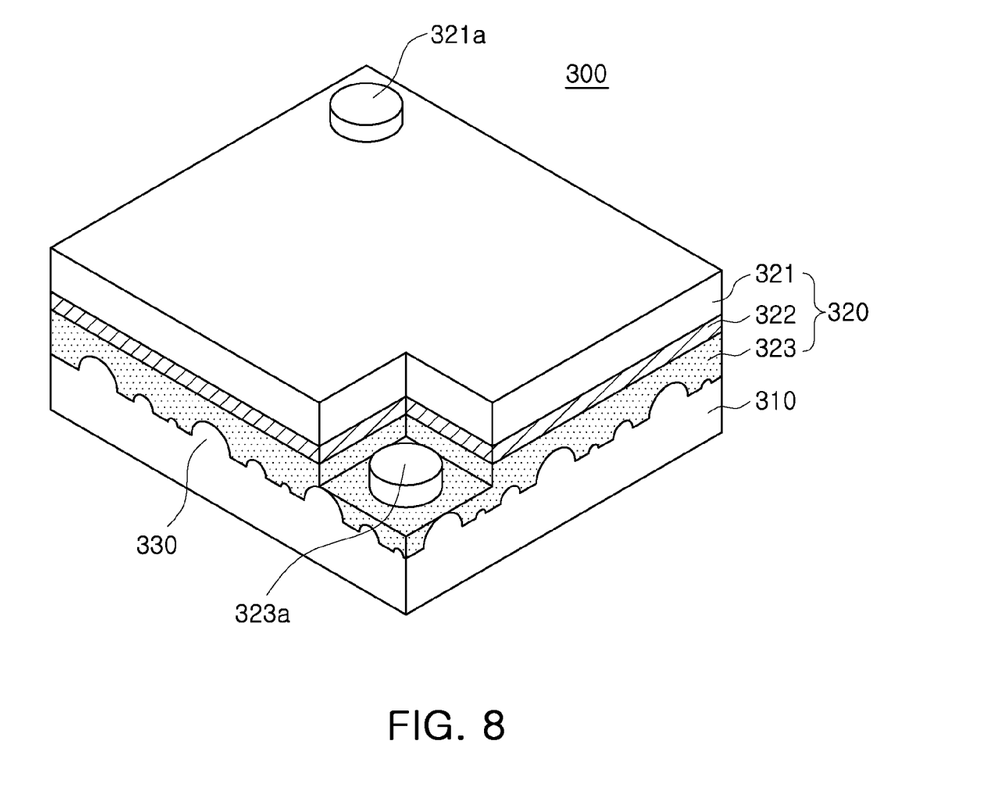
FIG. 8 is a perspective view of a semiconductor light emitting device according to a third exemplary embodiment of the present invention.

The convex parts 130a, 130b and 130c constituting the pattern may have a conical shape as illustrated in FIG. 4. Also, the convex parts 130a, 130b and 130c may have a hemispherical shape as illustrated in FIG. 5. The patterns 130 and 130' of the semiconductor light emitting device according to the present invention may be formed through a dry etching process. Conventionally, a wet etching process using a solution such as KOH is used to form a surficial concavo-convex structure. However, when a dry etching process is used, because the size and shape thereof can be accurately controlled, a concavo-convex structure of a desired shape can be formed. FIG. 8 illustrates the results of the simulation of the light extraction efficiency in the case in which the convex part has a cylindrical/conical shape. As illustrated in FIG. 7, it can be seen that external light extraction efficiency increases significantly when it has a conical shape.

Figure 6:
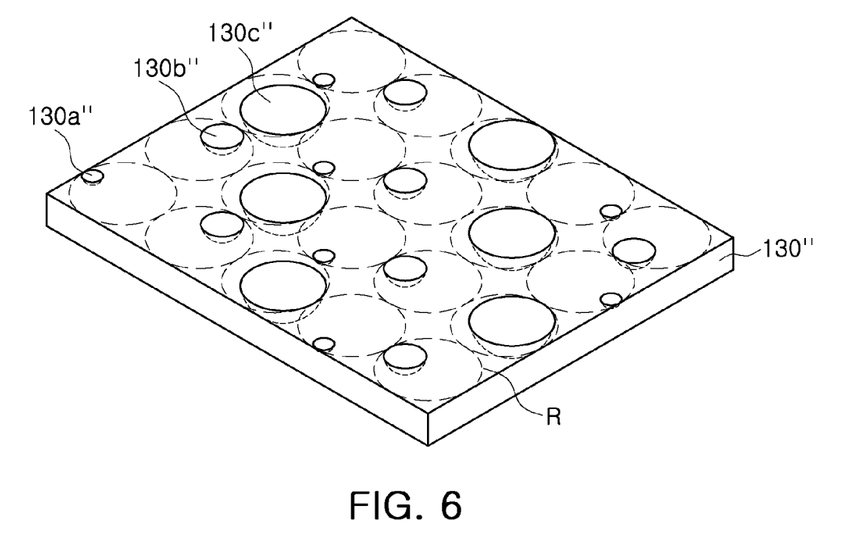
FIG. 6 is a perspective view illustrating a pattern of a semiconductor light emitting device according to another exemplary embodiment of the present invention.

FIG. 6 is a perspective view illustrating a pattern of a semiconductor light emitting device according to another exemplary embodiment of the present invention.

Referring to FIG. 6, unlike the embodiment illustrated in FIG. 5, the pattern 130' may have the shape of a concave part. The concave parts 130a', 130b' and 130c' constituting the pattern 130' may be formed to have a hemispherical shape as illustrated in FIG. 6. A dry etching process may be used to form the hemispherical shape. Also, unlike this embodiment, the concave parts 130a', 130b' and 130c' may have various shapes such as a hemisphere, a cone, and a pyramid.

FIG. 7 is a perspective view of a semiconductor light emitting device according to a second exemplary embodiment of the present invention.

Referring to FIG. 7, in a semiconductor light emitting device 200 according to a second exemplary embodiment of the present invention, a light emitting structure 220 including an active region 222 is formed on a substrate 210, and a concavo-convex structure may be formed in a portion of the light emitting structure 220. The light emitting structure 220 may include a first-conductivity-type semiconductor layer 221, an active layer 222, and a second-conductivity-type semiconductor layer 223 that are sequentially stacked. The first-conductivity-type semiconductor layer 221 and the second-conductivity-type semiconductor layer 223 constituting the light emitting structure 220 may be respectively an n-type semiconductor layer and a p-type semiconductor layer, and may be formed of a nitride semiconductor. In this case, the light emitting structure 220 may have a composition and structure similar to that of the first embodiment.

According to this embodiment, unlike the embodiment illustrated in FIG. 1, a pattern may be formed by etching a portion of the first-conductivity-type semiconductor layer 221 of the light emitting structure 220, instead of by providing a separate layer on the light emitting structure 220. In this case, the pattern may be formed to have the same rule as the first embodiment. The only difference is the pattern forming material. That is, the concavo-convex structure formed on the first-conductivity-type semiconductor layer 221 can increase external light extraction efficiency by reducing the rate of total reflection in the first-conductivity-type semiconductor layer 221 with respect to the light emitted from the active layer 222 of the light emitting structure 220. Unlike the illustration of FIG. 7, the pattern may have various shapes such as that of a cone.

Unlike the first embodiment, the substrate 210 may include a nitride semiconductor growth substrate. Specifically, the nitride semiconductor growth substrate may include a substrate including a material such as sapphire, SiC, $MgAl_2O_4$, MgO, $LiAlO_2$, $LiGaO_2$, and GaN. That is, the pattern 230 may be formed by etching a portion of the first-conductivity-type semiconductor layer 221 exposed to the outside of the light emitting structure 220 including the first-conductivity-type semiconductor layer 221, the active layer 222 and the second-conductivity-type semiconductor layer 223 that are sequentially formed on the nitride growth substrate 210 formed of sapphire. Also, as illustrated in FIG. 6, a second-conductivity-type electrode 223a may be formed on the second-conductivity-type semiconductor layer 223 exposed by etching a portion of the second-conductivity-type semiconductor layer 223, the active layer 222 and the first-conductivity-type semiconductor layer 221, and a second-conductivity-type electrode 221a may be formed on the top surface of the first-conductivity-type semiconductor layer 221, so that an electrical signal can be applied from the outside through the first-conductivity-type electrode 221a and the second-conductivity-type electrode 223a.

FIG. 8 is a perspective view of a semiconductor light emitting device according to a third exemplary embodiment of the present invention.

Referring to FIG. 8, a semiconductor light emitting device 300 according to a third exemplary embodiment of the present invention may include a light emitting structure 320 including a first-conductivity-type semiconductor layer 321, an active layer 322, and a second-conductivity-type semiconductor layer 323 that are formed on a substrate 310; and a pattern 330 according to an exemplary embodiment of the present invention may be formed on the surface of the substrate 310. Also, a second-conductivity-type electrode 323a may be formed on the surface of the second-conductivity-type semiconductor layer 323 exposed by etching a portion of the second-conductivity-type semiconductor layer 323, the active layer 322 and the first-conductivity-type semiconductor layer 321 of the light emitting structure 320; and a second-conductivity-type electrode 321a may be formed on the top surface of the first-conductivity-type semiconductor layer 321. According to this embodiment, the pattern 330 having a convex part is formed on the substrate 310 formed on at least one light emitting surface among the surfaces of the light emitting structure 320. Accordingly, the rate of absorption in the semiconductor layer by refraction and diffusion on the surface of the pattern 330 with respect to the light emitted from the active layer 322 of the light emitting structure 320 to the substrate 310 is reduced, thus improving external light extraction efficiency.

Hereinafter, a process for fabricating the semiconductor light emitting device 100 will be described in detail. First, a buffer layer (not illustrated), a second-conductivity-type semiconductor layer 123, an active layer 122, and a first-conductivity-type semiconductor layer 121 are sequentially formed on a growth substrate (not illustrated) through a semiconductor growth process such as MOCVD, MBE and HVPE to form a light emitting structure 120. In this case, in terms of structure, the light emitting structure 120 is defined as a structure including the second-conductivity-type semiconductor layer 123, the active layer 122, and the first-conductivity-type semiconductor layer 121. However, in terms of growth/etching processes, the buffer layer (not illustrated) may also be regarded as an element constituting the light emitting structure.

The semiconductor growth substrate may include a substrate including a material such as sapphire, SiC, $MgAl_2O_4$, MgO, $LiAlO_2$, $LiGaO_2$, and GaN. In this case, the sapphire is a Hexa-Rhombo R3c symmetric crystal, which has a c-axis lattice constant of 13.001Å and an a-axis lattice constant of 4.758Å and includes a C (0001) plane, an A (1120) plane, and an R (1102) plane. In this case, because the C plane is relatively easy for the growth of a nitride layer and is stable at high temperature, it is mainly used as a nitride growth substrate. The buffer layer may include an undoped semiconductor layer formed of a nitride, and may reduce the lattice defects of the light emitting structure grown thereon.

A conductive substrate 110 is adhered to the top surface of the light emitting structure 120. The conductive substrate 110 may serve as a support member in a laser lift-off process for removing the growth substrate, and an electrode of the first-conductivity-type semiconductor layer 121 may be formed on the bottom surface thereof. The conductive substrate 110 may include a material including any one of Au, Ni, Al, Cu, W, Si, Se and GaAs, for example, a Si substrate doped with Al. Also, the conductive substrate 110 maybe joined to the light emitting structure 120 through the medium of a conductive adhesive layer (not illustrated), and may be formed through a suitable process such as a sputtering process and a deposition process. For example, the conductive adhesive layer may include a eutectic metal such as AuSn. When the conductive substrate 110 is joined to the light emitting structure, a physical impact may be applied to the light emitting structure and diffusion may occur from the conductive adhesive layer.

As described above, the semiconductor growth substrate may be removed through a laser lift-off process or a chemical lift-off process. A pattern 130 may be formed on the second-conductivity-type semiconductor layer 123 exposed after the formation of the growth substrate. In order to forma pattern 130 having a plurality of convex parts 130a, 130b and 130c, a transparent conductor or a transparent insulator may be coated or deposited. The deposition process may include a PECVD (Plasma Enhanced Chemical Vapor Deposition) process, an LPCVD (Low Pressure CVD) process, and a sputtering process. The pattern 130 having the convex parts 130a, 130b and 130c may include a transparent conductor or a transparent insulator. The transparent insulator may include a material such as $SiO_2$, $SiN_x$, $Al_2O_3$, HfO, $TiO_2$, or ZrO. The transparent conductor may include a transparent conductive oxide ($TCO_x$) such as an indium (In) oxide containing ZnO or additives (e.g., Mg, Ag, Zn, Sc, Hf, Zr, Te, Se, Ta, W, Nb, Cu, Si, Ni, Co, Mo, and Cr).

As illustrated in FIG. 1, the transparent conductor or the transparent insulator may be etched through a dry etching process to have the shape of a cone with a diameter of 0.5 µm to 2 µm. The dry etching process may include an RIE (Reactive Ion Etching) process or an ICP-RIE (Inductive Coupled Plasma RIE) process. A dry etching process (rather than a wet etching process using a KOH solution) may be used to form a more accurate concavo-convex structure, and to form a conical concavo-convex structure as illustrated in FIG. 1.

Unlike this, a concavo-convex pattern 130 may be formed on the light emitting structure 120 including the first-conductivity-type semiconductor layer 121, the active layer 122 and the second-conductivity-type semiconductor layer 123 formed sequentially on the growth substrate 110, through the same process as described above, instead of adhering the conductive substrate 110 to the top surface of the light emitting structure 120. Herein, the first-conductivity-type semiconductor layer 121 may include a nitride semiconductor doped with n-type impurities. A second-conductivity-type electrode may be formed on the second-conductivity-type semiconductor layer 123. A first-conductivity-type electrode may be formed on the first-conductivity-type semiconductor layer 121 exposed by mesa-etching a portion of the second-conductivity-type semiconductor layer 123, the active layer 122 and the first-conductivity-type semiconductor layer 121.

Figure 9:
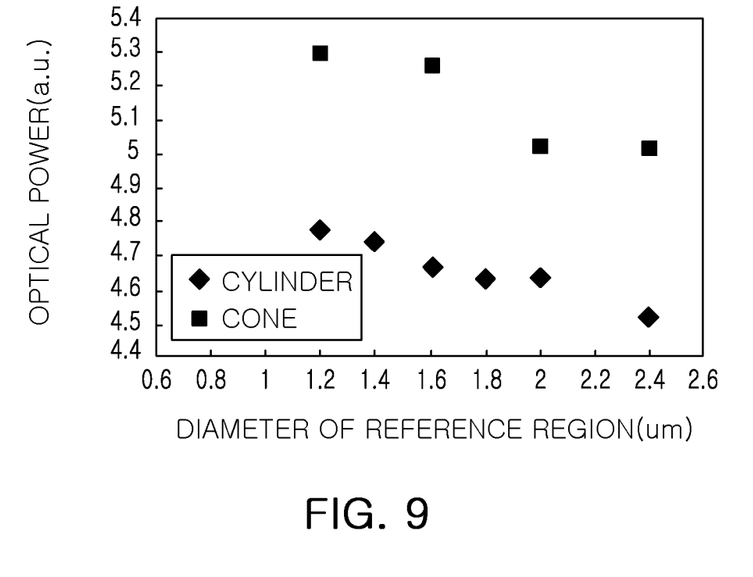
FIG. 9 is a graph illustrating the results of a simulation of the light extraction efficiency according to the shape of a convex part.

FIG. 9 is a graph illustrating the results of the simulation of the light extraction efficiency in the case of using a concavo-convex structure of a cylindrical/conical shape having the same diameter.

In FIG. 9, the axis of abscissas represents a diameter, and the axis of ordinates represents optical power. It can be seen from the graph of FIG. 9 that providing a conical concavo-convex pattern on the entire region can significantly increase the light extraction efficiency, regardless of the size of the reference region, as a result of the comparison of the light extraction efficiency of a cylindrical concavo-convex pattern and the light extraction efficiency of a conical concavo-convex pattern with respect to the concavo-convex pattern of the same diameter.

Figure 10A:
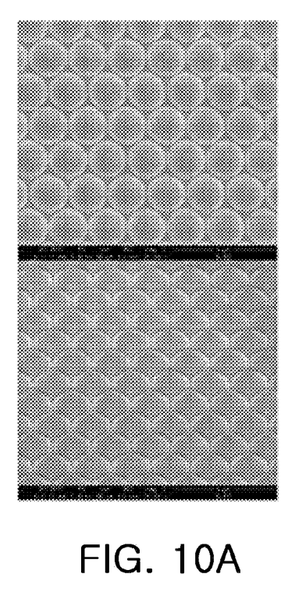
FIGS. 10A, 10B and 10C are pictures of patterns formed on a light emitting structure.
Figure 10B:
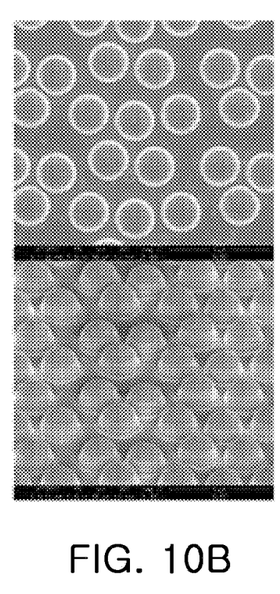
Figure 10C:
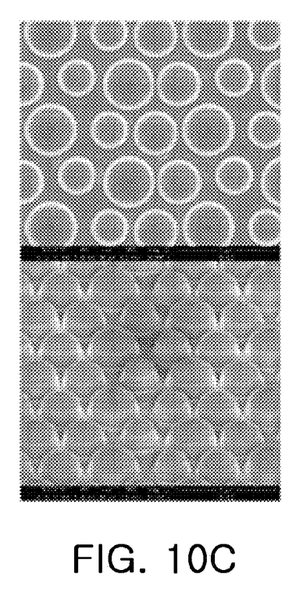
Figures 11A, 11B, 11C:
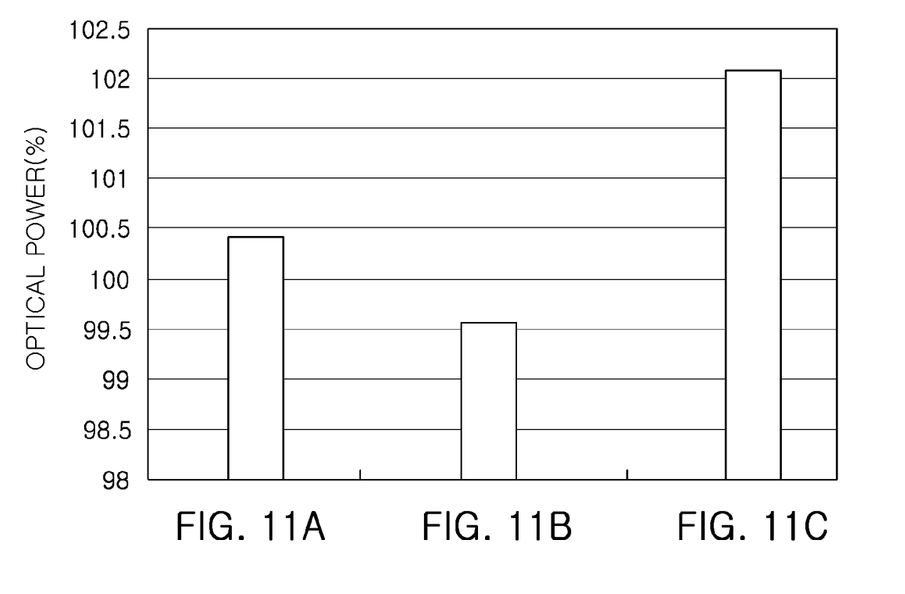
FIGS. 11A, 11B and 11C are graphs illustrating a comparison between the optical powers of the patterns of FIGS. 10A, 10B and 10C.

FIGS. 10A, 10B and 10C are pictures of patterns formed on a light emitting structure. FIGS. 11A, 11B and 11C are graphs illustrating the comparison between the optical powers of the patterns of FIGS. 10A, 10B and 10C.

In FIGS. 10A, 10B and 10C, the axis of abscissas represents relative optical power, when the optical power of the case in which a completely random pattern is formed through a wet etching process using a KOH solution is 100. FIG. 10A illustrates the picture of a structure in which convex parts of the same size are arranged at regular intervals in a regular manner. FIG. 10B illustrates the picture of a structure of the present invention in which reference regions of the same size are arranged in a regular manner; a plurality of convex parts are disposed in the reference regions while contacting the boundaries of the reference regions in such a manner as to rotate the centers of the reference regions in a predetermined direction; and the convex parts have the same size. FIG. 10C illustrates the picture of a structure according to an exemplary embodiment of the present invention in which a plurality of circular patterns with different sizes are provided; reference regions of the same size are arranged in a regular manner; and the patterns are disposed in the reference regions while contacting the boundaries of the reference regions in such a manner as to rotate the centers of the reference regions in a clockwise direction. In FIGS. 10A to 10C, the patterns illustrated have the same average diameter. Referring to FIG. 11, it can be seen that the optical power of the concavo-convex pattern according to the present invention can significantly increase the optical power, when compared to the concavo-convex pattern illustrated in FIG. 10A.

Figure 12:
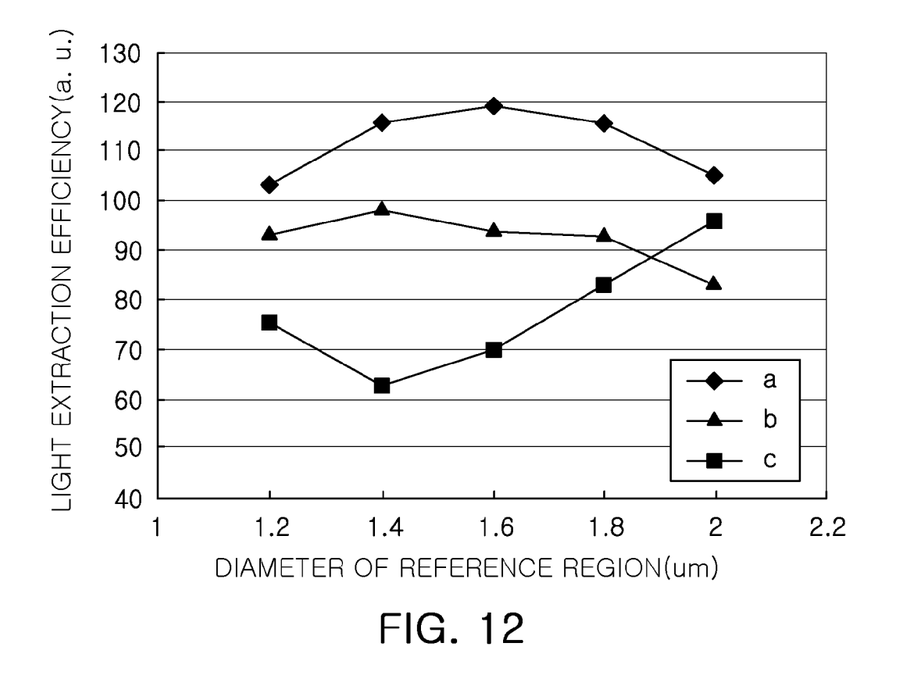
FIG. 12 is a graph illustrating the results of a simulation of the light extraction efficiency according to the size of a pattern.

FIG. 12 is a graph illustrating the results of the simulation of the light extraction efficiency according to the interval between reference regions.

In this embodiment, the reference region has a circular shape, and the pattern includes three circular convex parts that have different sizes and has an average diameter of 1 µm. The convex parts are sequentially disposed in the reference regions while contacting the outlines of the reference regions in such a manner as to rotate around the centers of the reference regions by 90° in a clockwise direction. In FIG. 12, the axis of abscissas represents the diameter of the reference region, and the axis of ordinates represents the light extraction efficiency. Graph 'a' represents the results of the measurement of the light extraction efficiency in the case in which the interval between the reference regions is 0 µm; graph 'b' represents the results of the measurement of the light extraction efficiency in the case in which the interval between the reference regions is 0.2 µm; and graph 'c' represents the results of the measurement of the light extraction efficiency in the case in which the interval between the reference regions is 0.5 µm. Referring to FIG. 12, it can be seen that the light extraction efficiency increases as the interval between the reference regions decreases.

Figure 13:
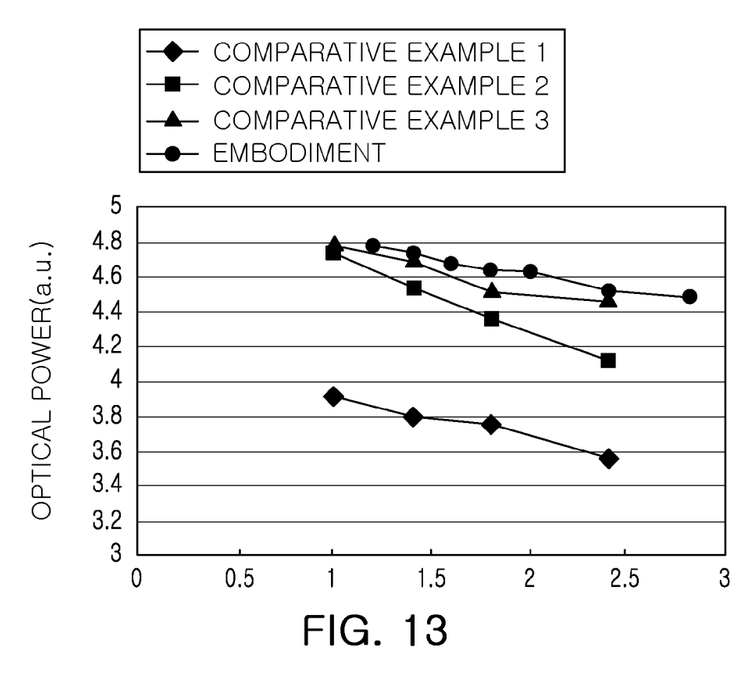
FIG. 13 is a graph illustrating a comparison between the optical power of a semiconductor light emitting device having patterns according to an exemplary embodiment of the present invention and the optical power of a semiconductor light emitting device having patterns arranged at regular intervals.

FIG. 13 is a graph illustrating the comparison between the optical power of a semiconductor light emitting device having patterns according to an exemplary embodiment of the present invention and the optical power of a semiconductor light emitting device having patterns arranged at regular intervals.

In FIG. 13, the axis of abscissas represents the diameter of the pattern, and the axis of ordinates represents the optical power. Comparative examples 1 to 3 represent the optical power in the case in which patterns of the same size are arranged at regular intervals. Herein, the interval between the patterns is changed while maintaining the other conditions. Comparative example 1 represents the optical power in the case in which the interval between the patterns is 0 µm; comparative example 2 represents the optical power in the case in which the interval between the patterns is 0.2 µm; and comparative example 3 represents the optical power in the case in which the interval between the patterns is 0.4 µm. In the exemplary embodiment, three patterns having different sizes are disposed in the reference regions while contacting the outlines of the reference regions; the difference in diameter between the patterns being 0.4 µm; and the diameter of the pattern represented on the axis of abscissas is based on the pattern having the maximum diameter. That is, if the diameter of the pattern is represented as 1 µm, the pattern with a diameter of 1 µm, the pattern with a diameter of 0.6 µm and the pattern with a diameter of 0.2 µm are arranged in the reference regions and the diameter of the reference region is equal to the diameter of the largest pattern. Referring to the comparative examples 1 to 3, it can be seen that the interval between the patterns affects the optical power. Specifically, it can be seen that the optical power increases as the interval between the patterns decreases. According to the exemplary embodiment, because the patterns have different diameters and the patterns are disposed in the reference regions while contacting the outlines of the reference regions, the interval between the patterns ranges from 0 µm to 2 µm. As can be seen from FIG. 12, the exemplary embodiment can provide the higher optical power in the entire region, when compared to the comparative example 1 where the interval between the patterns is minimal.

Figure 14:
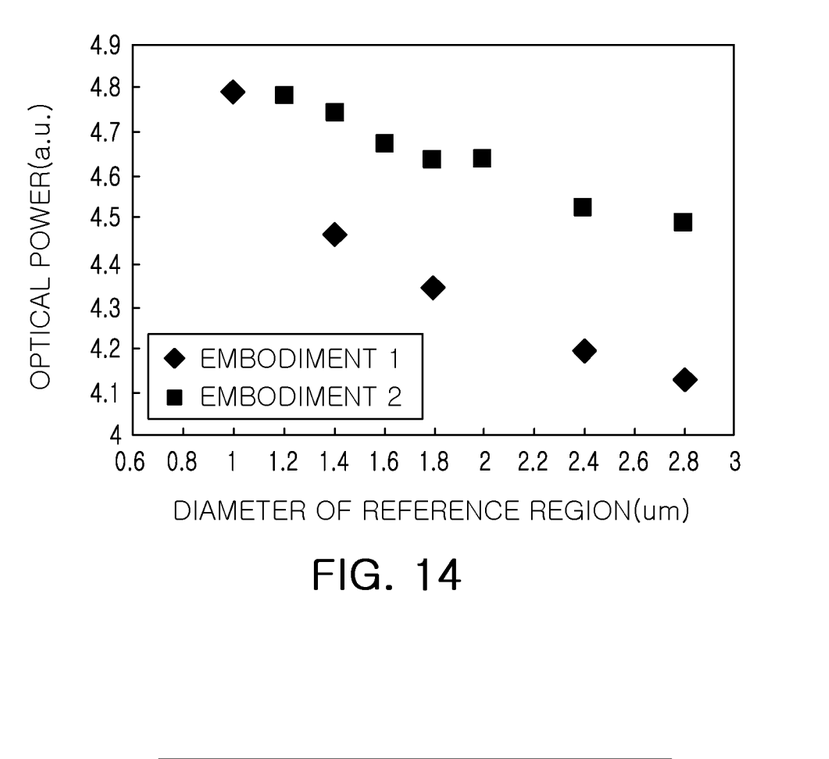
FIG. 14 is a graph illustrating the results of a simulation of light extraction efficiency according to the difference in diameter between patterns.

FIG. 14 is a graph illustrating the results of the simulation of the light extraction efficiency according to the difference in diameter between patterns.

In FIG. 14, the axis of abscissas represents the diameter of the reference region, and the axis of ordinates represents the optical power. In exemplary embodiments 1 and 2, the diameter of the largest pattern is equal to the diameter of the reference region. In exemplary embodiment 1, the difference between the patterns is 0.2 µm. In exemplary embodiment 2, the difference between the patterns is 0.4 µm. For example, if the diameter of the reference region is 2.0 µm in exemplary embodiment 1, the pattern with a diameter 1.6 µm, the pattern with a diameter 1.8 µm and the pattern with a diameter 2.0 µm are disposed in the reference regions in this embodiment and the pattern with a diameter 1.2 µm, the pattern with a diameter 1.6 µm and the pattern with a diameter 2.0 µm are disposed in the reference regions in exemplary embodiment 2. Referring to FIG. 13, it can be seen that the optical power increases as the difference in diameter between the patterns increases, that is, as the randomness increases.

Figure 15:
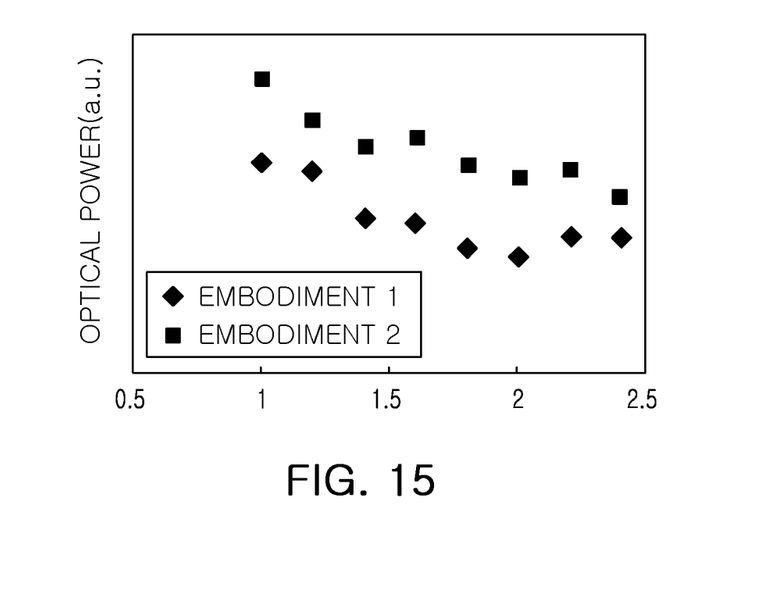
FIG. 15 is a graph illustrating the results of a simulation of light extraction efficiency according to the depth of a pattern.

FIG. 15 is a graph illustrating the results of the simulation of the light extraction efficiency according to the depth of a pattern.

In FIG. 15, the axis of abscissas represents the diameter of the reference region, and the axis of ordinates represents the optical power. Exemplary embodiments 1 and 2 are to compare the optical power while varying the height of the convex part of the pattern according to an exemplary embodiment of the present invention. Specifically, exemplary embodiment 1 represents the optical power in the case in which the height of the convex part disposed in the reference region is 1 µm; and exemplary embodiment 2 represents the optical power in the case in which the height of the convex part disposed in the reference region is 2 µm. The other conditions except the height of the convex part are the same. Referring to FIG. 15, it can be seen that external light extraction efficiency increases, because the light refraction/diffusion rate increases as the height of the convex part increase.

As described above, the present invention can increase the rate of light emissions to the outside through the concavo-convex part on the semiconductor layer, with respect to the light emitted from the active region, thereby making it possible to increase the light extraction efficiency of the semiconductor light emitting device. Also, the present invention can improve light distribution, thereby making it possible to increase the light uniformity.

While the present invention has been shown and described in connection with the exemplary embodiments, it will be apparent to those skilled in the art that modifications and variations can be made without departing from the spirit and scope of the invention as defined by the appended claims.

What is claimed is:

1. A semiconductor light emitting device comprising:
   a light emitting structure comprising a first-conductivity-type semiconductor layer, an active layer, and a second-conductivity-type semiconductor layer; and
   a pattern disposed on at least one light emitting surface among the surfaces of the light emitting structure, the pattern having a plurality of convex or concave parts that are similar in shape, wherein:
   the light emitting surface with the pattern thereon has a plurality of regions defined such that the regions are equal in size and are arranged linearly in a first direction and a second direction perpendicular to the first direction, and each of the regions has a substantially circular shape and is in contact with at least two regions adjacent thereto,
   each of the convex or concave parts is disposed in a corresponding one of the plurality of regions such that a part of the edge of each convex or concave part is in contact with the outline of the corresponding region, and
   first and second convex or concave parts arranged in the first direction, among the plurality of convex or concave parts, are sequentially disposed in first and second regions, among the plurality of regions, corresponding to the first and second convex or concave parts such that the edge part of the first convex or concave part in contact with the outline of the first region has a rotational position with respect to the center of the first region, clockwise or counterclockwise from a rotational position of the edge part of the second convex or concave part in contact with the outline of the second region with respect to the center of the second region, and third and fourth convex or concave parts arranged in the second direction, among the plurality of convex or concave parts, are sequentially disposed in third and fourth regions, among the plurality of regions, corresponding to the third and fourth convex or concave parts such that the edge parts of the third and fourth convex or concave parts in contact with the outlines of the third and fourth regions have an identical rotational position with respect to the respective centers of the third and fourth regions.

2. The semiconductor light emitting device of claim 1, wherein
the light emitting structure is disposed on a substrate, and
the pattern is disposed on the substrate.

3. The semiconductor light emitting device of claim 1, wherein the pattern is disposed on the second-conductivity-type semiconductor layer.

4. The semiconductor light emitting device of claim 1, wherein the pattern is disposed in a portion of the second-conductivity-type semiconductor layer.

5. The semiconductor light emitting device of claim 1, wherein the second-conductivity-type semiconductor layer is doped with n-type or p-type impurities.

6. The semiconductor light emitting device of claim 1, wherein the size of each region is equal to or greater than the size of a contact surface between the region and the convex or concave part disposed in each region.

7. The semiconductor light emitting device of claim 1, wherein contact surfaces between the convex or concave parts and the corresponding regions have different sizes.

8. The semiconductor light emitting device of claim7, wherein:
the convex or concave parts are arranged in ascending order of the size of the contact surface with the corresponding regions to constitute a group, and
the group is disposed in a repeated manner.

9. The semiconductor light emitting device of claim 1, wherein each region has a diameter of 0.1 μm to 5 μm.

10. The semiconductor light emitting device of claim 1, wherein the contact surfaces between the convex or concave parts and the corresponding regions have a substantially circular shape.

11. The semiconductor light emitting device of claim 10, wherein the contact surfaces between the convex or concave parts and the corresponding regions have a diameter of 0.1 μm to 5 μm.

12. The semiconductor light emitting device of claim 1, wherein the convex or concave parts have a shape similar to one of a hemispherical shape and a conical shape.

13. The semiconductor light emitting device of claim 1, wherein the contact surfaces between the convex or concave parts and the corresponding regions have the same shape.

14. The semiconductor light emitting device of claim 1, wherein the particular regions are arranged in a row such that the centers of the particular regions are positioned along a same line.

15. The semiconductor light emitting device of claim 1, wherein at least two of the plurality of convex or concave parts have different sizes.

16. The semiconductor light emitting device of claim 1, wherein the convex or concave parts are arranged linearly only in one of the first and second directions.

17. The semiconductor light emitting device of claim 1, wherein the convex or concave parts arranged in the first direction are sequentially disposed in irregular intervals and the convex or concave parts arranged in the second direction are sequentially disposed in a regular interval.

18. A method for fabricating a semiconductor light emitting device, comprising:
forming a light emitting structure comprising a first-conductivity-type semiconductor layer, an active layer, and a second-conductivity-type semiconductor layer on a growth substrate;
forming a conductive substrate on the light emitting structure;
removing the growth substrate; and
forming a pattern on at least one light emitting surface among surfaces of the light emitting structure exposed by removing the growth substrate, wherein:
the light emitting surface with the pattern formed thereon has a plurality of regions defined such that the regions are equal in size and are arranged linearly in a first direction and a second direction perpendicular to the first direction, and each of the regions has a substantially circular shape and is in contact with at least two regions adjacent thereto,
a plurality of convex or concave parts are disposed in the plurality of regions such that a part of the edge of each convex or concave part is in contact with the outline of a corresponding one of the plurality of regions,
first and second convex or concave parts arranged in the first direction, among the plurality of convex or concave parts, are sequentially disposed in first and second regions, among the plurality of regions, corresponding to the first and second convex or concave parts such that the edge part of the first convex or concave part in contact with the outline of the first region has a rotational position with respect to the center of the first region, clockwise or counterclockwise from a rotational position of the edge part of the second convex or concave part in contact with the outline of the second region with respect to the center of the second region,
third and fourth convex or concave parts arranged in the second direction, among the plurality of convex or concave parts, are sequentially disposed in third and fourth regions, among the plurality of regions, corresponding to the third and fourth convex or concave parts such that the edge parts of the third and fourth convex or concave parts in contact with the outlines of the third and fourth regions have an identical rotational position with respect to the respective centers of the third and fourth regions, and
the forming of the pattern is performed through a dry etching process.

19. A method for fabricating a semiconductor light emitting device, comprising:
forming a light emitting structure comprising a first-conductivity-type semiconductor layer, an active layer, and a second-conductivity-type semiconductor layer on a growth substrate; and
forming a pattern on at least one light emitting surface among surfaces of the light emitting structure, wherein:

the light emitting surface with the pattern formed thereon has a plurality of regions defined such that the regions are equal in size and are arranged linearly in a first direction and a second direction perpendicular to the first direction, and each of the regions has a substantially circular shape and is in contact with at least two regions adjacent thereto, a plurality of convex or concave parts are disposed in the plurality of regions such that a part of the edge of each convex or concave part is in contact with the outline of a corresponding one of the plurality of regions, first and second convex or concave parts arranged in the first direction, among the plurality of convex or concave parts, are sequentially disposed in first and second regions, among the plurality of regions, corresponding to the first and second convex or concave parts such that the edge part of the first convex or concave part in contact with the outline of the first region has a rotational position with respect to the center of the first region, clockwise or counterclockwise from a rotational position of the edge part of the second convex or concave part in contact with the outline of the second region with respect to the center of the second region, third and fourth convex or concave parts arranged in the second direction, among the plurality of convex or concave parts, are sequentially disposed in third and fourth regions, among the plurality of regions, corresponding to the third and fourth convex or concave parts such that the edge parts of the third and fourth convex or concave parts in contact with the outlines of the third and fourth regions have an identical rotational position with respect to the respective centers of the third and fourth regions, and the forming of the pattern is performed through a dry etching process.

* * * * *